United States Patent [19]

Vasquez

[11] 4,277,698
[45] Jul. 7, 1981

[54] DELAY TYPE FLIP-FLOP
[75] Inventor: Ray M. Vasquez, Chandler, Ariz.
[73] Assignee: Motorola, Inc., Schaumburg, Ill.
[21] Appl. No.: 44,448
[22] Filed: Jun. 1, 1979
[51] Int. Cl.[3] .............................................. H03K 3/289
[52] U.S. Cl. ................................. 307/272 A; 307/291
[58] Field of Search ................... 307/272 A, 289, 291, 307/292, 279

[56] References Cited
U.S. PATENT DOCUMENTS 3,812,384   5/1974   Skorup ............................ 307/272 A Primary Examiner—John Zazworsky
Attorney, Agent, or Firm—Vincent B. Ingrassia

[57] ABSTRACT

In a master-slave delay type flip-flop, a first transistor transfers the data at the D input to an inverter stage when the clock signal goes low. When the clock signal again goes high, the inverter data is transferred to a second inverter stage which forms the flip-flop $\overline{Q}$ output. Feedback means have provided for latching the inputs to both the first and second inverter stages. An inverting transistor in one of the feedback paths forms the Q output of the flip-flop. Additional embodiments of the D-type flip-flop circuit include both asynchronous set and reset features.

4 Claims, 3 Drawing Figures

DELAY TYPE FLIP-FLOP

BACKGROUND OF THE INVENTION

1. Field of the Invention

This invention relates generally to flip-flop circuitry for use in digital computers, control systems and the like and, more particularly, to a monolithically integrable delay (D) type flip-flop.

2. Description of the Prior Art

Known delay type flip-flop circuitry requires the generation of a reference voltage and includes complex biasing and level shifting circuits. This not only adds to the complexity and cost of the device but also adversely effects the switching speed of the flip-flop. Since the reference voltage has a tendency to change with temperature variations, the level shifting circuitry must have the capability of tracking reference voltage variations. Furthermore, due to the complexity of the circuit, a relatively large amount of silicon area is occupied when the flip-flop is monolithically integrated.

SUMMARY OF THE INVENTION

It is an object of the present invention to provide an improved delay type flip-flop.

It is a further object of the invention to provide a delay type flip-flop which does not require the inclusion of level shifting and reference voltage generating circuits.

It is yet another object of the present invention to provide a delay type flip-flop including master and slave portions which are electrically isolated from each other.

Finally, it is an object of the present invention to provide a delay type flip-flop which, when monolithically integrated, requires less silicon area than currently known delay type flip-flops.

According to a broad aspect of the invention there is provided a master-slave delay type flip-flop having a first input, a first non-inverted output and a first inverted output for receiving logical data at said first input and transferring said logical data to said first inverted and non-inverted outputs, said flip-flop being responsive to first and second clock signals each capable of assuming first and second voltage levels, comprising: first transfer means coupled to said first input for transferring said data when said first clock signal assumes said first voltage level; a first inverter coupled to said first transfer means for inverting said data; second transfer means coupled to said first inverter for transferring inverted data when said second clock signal assumes said first voltage level; and a second inverter coupled to said second transfer means for reinverting said data to form said first non-inverted output.

According to a further aspect of the invention there is provided a master-slave delay type flip-flop having a first input, a first non-inverted output and a first inverted output for receiving logical data at said first input and transferring said logical data to said first inverting and non-inverting outputs, said flip-flop being responsive to a clock signal which is capable of assuming first and second logic levels, comprising: first transfer means having an input coupled to said first input, and having an output, said first transfer means for transferring said data to said output when said clock signal assumes said first voltage level; a first inverter having an input coupled to the output of said first transfer means and having an output for inverting said data; first feedback means coupled between the output of said first inverter and the output of the first transfer means for latching the input of said first inverter; second transfer means having an input coupled to the output of said first inverter and having an output, said second transfer means for transferring inverted data when said clock signal assumes said second voltage level; a second inverter having an input coupled to the output of said second transfer means for reinverting said data, the output of said second inverter forming said first non-inverted output; and second feedback means coupled between the output said second inverting means and the input of second inverting means for latching the input of said second inverting means.

The above and other objects, features and advantages of the present invention will be more clearly understood from the following detailed description taken in conjunction with the accompanying drawings, in which:

DESCRIPTION OF THE PREFERRED EMBODIMENT

Figure 1:
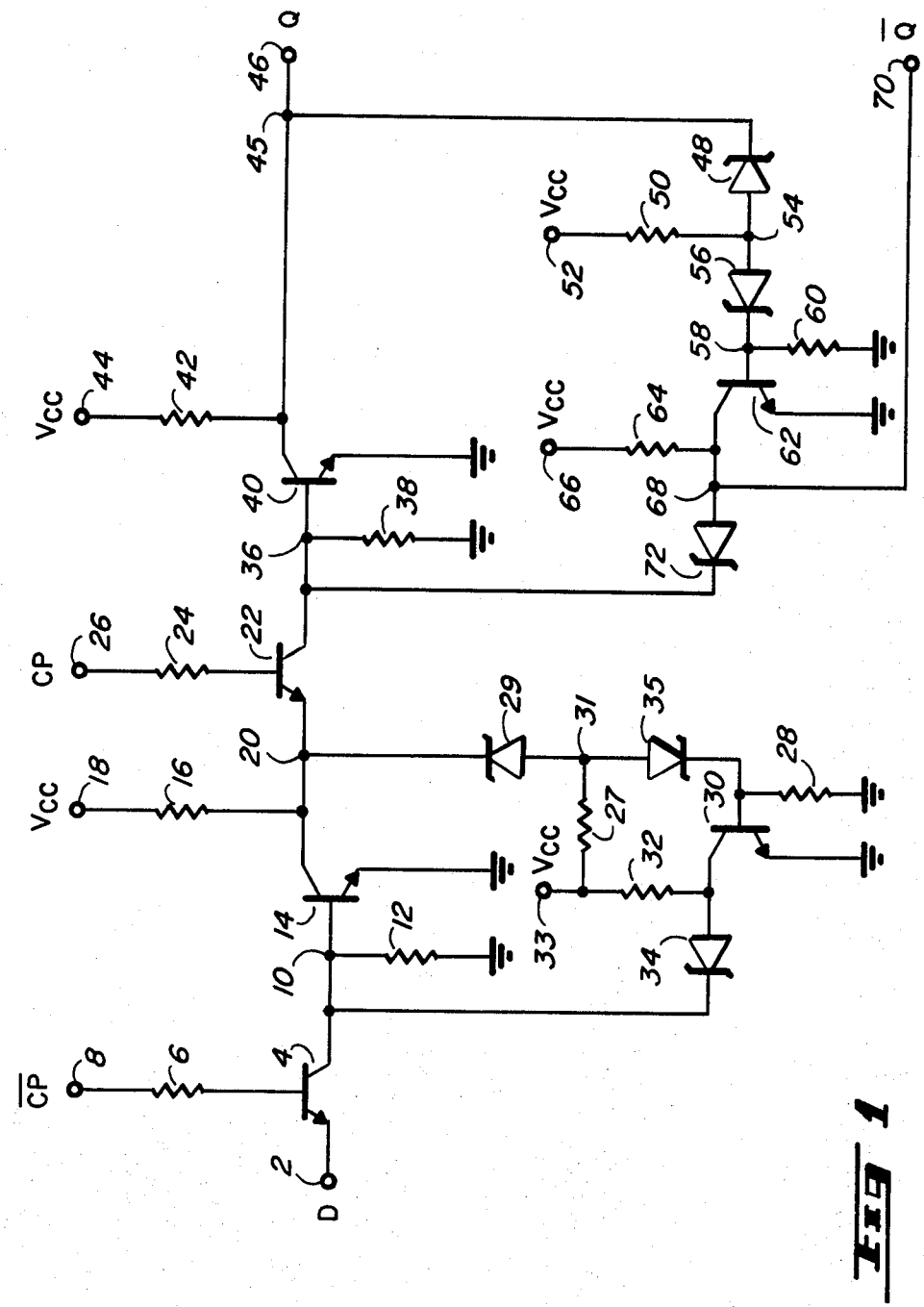
FIG. 1 is a schematic diagram of the inventive delay type flip-flop.

Referring to FIG. 1, the inventive delay type flip-flop includes a master portion and a slave portion. The master portion includes a transfer gate or transistor 4 having an emitter coupled to the D input terminal 2 and having a base coupled, via load resistor 6, to an inverted clock pulse signal $\overline{(CP)}$ applied at terminal 8. The collector of transistor 4 (node 10) is coupled to ground via resistor 12 and is also coupled to the base of inverting transistor 14. The emitter of transistor 14 is coupled to ground, and the collector of transistor 14 is coupled, via load resistor 16, to a source of supply voltage (VCC) applied to terminal 18. A latching circuit is coupled between node 20 and node 10 and includes diodes 29, 34 and 35, resistors 27, 28 and 32, and transistor 30. The operation of this latching circuit will be fully described hereinbelow.

The slave portion of the circuit includes transistor 22 having an emitter coupled to the collector of transistor 14, and a base coupled, via load resistor 24, to the non-inverted clock pulse signal (CP) applied to terminal 26. Node 36 which is in common with the collector of transfer gate or transistor 22 is coupled to ground via pull down resistor 38 and is also coupled to the base of the inverting transistor 40. The emitter of transistor 40 is coupled to ground, and the collector of transistor 40 is coupled, via load resistor 42, to VCC at terminal 44. The Q output of the flip-flop is taken from the collector of transistor 40 as is shown at terminal 46. Coupled between node 45 and node 36 is a second latching circuit comprising diodes 48, 56 and 72, resistors 50, 60 and 64, and transistor 62. The $\overline{Q}$ output of the flip-flop (terminal 70) is taken from node 68 which is in common with the collector of transistor 62.

The truth table corresponding to the circuit shown in FIG. 1 is shown in table 1.

TABLE 1

| Q(t) | D | Q(t + 1) |
|---|---|---|
| 0 | 0 | 0 |
| 0 | 1 | 1 |
| 1 | 0 | 0 |
| 1 | 1 | 1 |

As can be seen, the state of the D input of the flip-flop appears at the Q output of the flip-flop one clock cycle later. This is accomplished as follows:

When the clock pulse CP becomes a logical zero (approximately 0.2 volts) transistor 22 is turned off. Since the inverted clock signal $\overline{CP}$ (the logical inverse of CP) is coupled to the base of transistor 4, a logical 1 (approximately 3.5 volts) is applied thereto. If, at this time, a logical zero appears on the D input at terminal 2, transistor 4 will be turned on causing node 10 to go to ground. If, on the other hand, a logical 1 appears at terminal 2, the voltage at node 10 will correspond to a logical 1. Thus, transistor 4 acts as a transfer gate. When a logical 0 is present at the D input (the emitter of transistor 4), transistor 4 operates in its forward active region, and when a logical 1 is applied to terminal 2, transistor 4 operates in its inverse active region. Thus, the information at terminal 2 is propagated to node 10.

With a logical 1 at node 10 (the base of transistor 14), transistor 14 will turn on causing node 20 to go to ground. Alternately, a logical 0 at node 10 results in a logical 1 at node 20. Thus, it can be seen that transistor 14 serves to invert the data at node 10. Resistor 12 coupled to the base of transistor 14 is employed to discharge the base diffusion capacitance of transistor 14 when the transistor switches from a logical 1 to a logical 0 state.

When a logical 1 appears at node 10, a logical 0 will appear at node 20 in the manner above described. This forward biases diode 29 which is coupled to VCC at terminal 33 by means of load resistor 27. Thus, the voltage at the base of transistor 30 remains low keeping transistor 30 off. The collector of transistor 30 which is coupled to VCC via load resistor 32 assumes a high level which is applied back to node 10 (the base of transistor 14). Thus, the low logic level at node 20 becomes latched.

If on the other hand, a logical 0 existed at node 10, a logical 1 would appear at node 20 causing diode 29 to be reverse biased. Thus, current would flow from VCC through resistor 27 and diode 35, and the voltage at the base of transistor 30 approaches one $V_{BE}$. This turns transistor 30 on causing its collector to go to ground which would in turn be applied back to the base of transistor 14. Diode 34 prevents current from flowing from the collector of transistor 4 into the collector of transistor 30, and resistor 28 serves as a discharge means for the base diffusion capacitance of transistor 30. Since the clock pulse CP is still low, transistor 22 remains off and the data flow stops at node 20 which has now assumed a state which is the inverse of the data applied to input terminal 2.

Transistor 22 has an emitter coupled to node 20, a collector coupled to node 36 and a base coupled, via load resistor 24, to the clock pulse CP at terminal 26. Transistor 22 transfers the logical state at node 20 to node 36. For example, if node 20 is at a logical 0, transistor 22 will turn on when the clock pulse CP goes to a logical 1 and the 0 level at node 20 will be transferred to node 36. If, on the other hand node 20 is at a logical 1, transistor 22 goes into the inverse active region, resulting in a logical 1 at node 36. Transistor 22 thus acts as a second transfer gate. Transistor 40 having a base coupled to node 36, an emitter coupled to ground and a collector coupled, via load resistor 42, to VCC at terminal 44 serves as did transistor 14 to invert the signal which appears at its base. Thus, a logical 0 at node 36 will appear as a logical 1 at node 45 (the collector of transistor 40). Similarly, a logical 1 at node 36 will be inverted and appear as a logical 0 at node 45. The Q output of the flip-flop (terminal 46) is taken from node 45 which is in common with the collector of transistor 40. Resistor 38 which is coupled between ground and the base of transistor 40 serves as a discharge path for the base diffusion capacitance of transistor 40.

A second latching circuit is coupled between node 45 and 36 and comprises diodes 48, 56 and 72, resistors 50, 60 and 64, and transistor 62. With a logical 0 at node 36, a logical 1 appears at node 45 which reverse biases diode 48. Thus, current will flow from VCC at terminal 52 through load resistor 50 and diode 56 causing the base voltage of transistor 62 to approch one $V_{BE}$. Transistor 62 turns on causing a logical 0 to appear at node 68. This logic level is applied back to the base of transistor 40 thus latching node 45 high. Diode 72 prevents current flow from the collector of transistor 22 to the collector of transistor 62.

When the flip-flop output is low, diode 48 is forward biased. The base of transistor 62 remains essentially at ground, thus keeping the transistor off. Since the collector of transistor 62 is coupled to VCC at terminal 66 via load resistor 64, a logical 1 is applied back into the base of transistor 40 latching its output (node 45) low. The $\overline{Q}$ output of the flip-flop which appears at node 70 is taken from node 68.

In summary, when the clock pulse is low, a logical 0 at the D input will be transferred to node 10 and will be inverted (appear as a logical 1 at node 20). When the clock pulse goes high, the logical 1 at node 20 will be transferred to node 36, will be inverted by transistor 40 and will appear as a logical 0 at node 45 and output terminal 46. Thus, the logical 0 appears at the flip-flop output one clock cycle later. Similarly, when the clock pulse is low, a logical 1 applied to terminal 2 will appear as a logical 1 at node 10 and a logical 0 at node 20. When the clock pulse goes high, the logical 0 at node 20 will be transferred to node 36 and become inverted at node 45. Thus, a logical 1 will appear at the output terminal 46 when a logical 1 is applied to the input terminal 2.

It should be clear that if the clock pulse signal applied to the base of transistor 4 slightly overlapped the clock signal appearing at the base of transistor 22, the latching circuit in the slave portion could be eliminated for certain applications.

Figure 2:
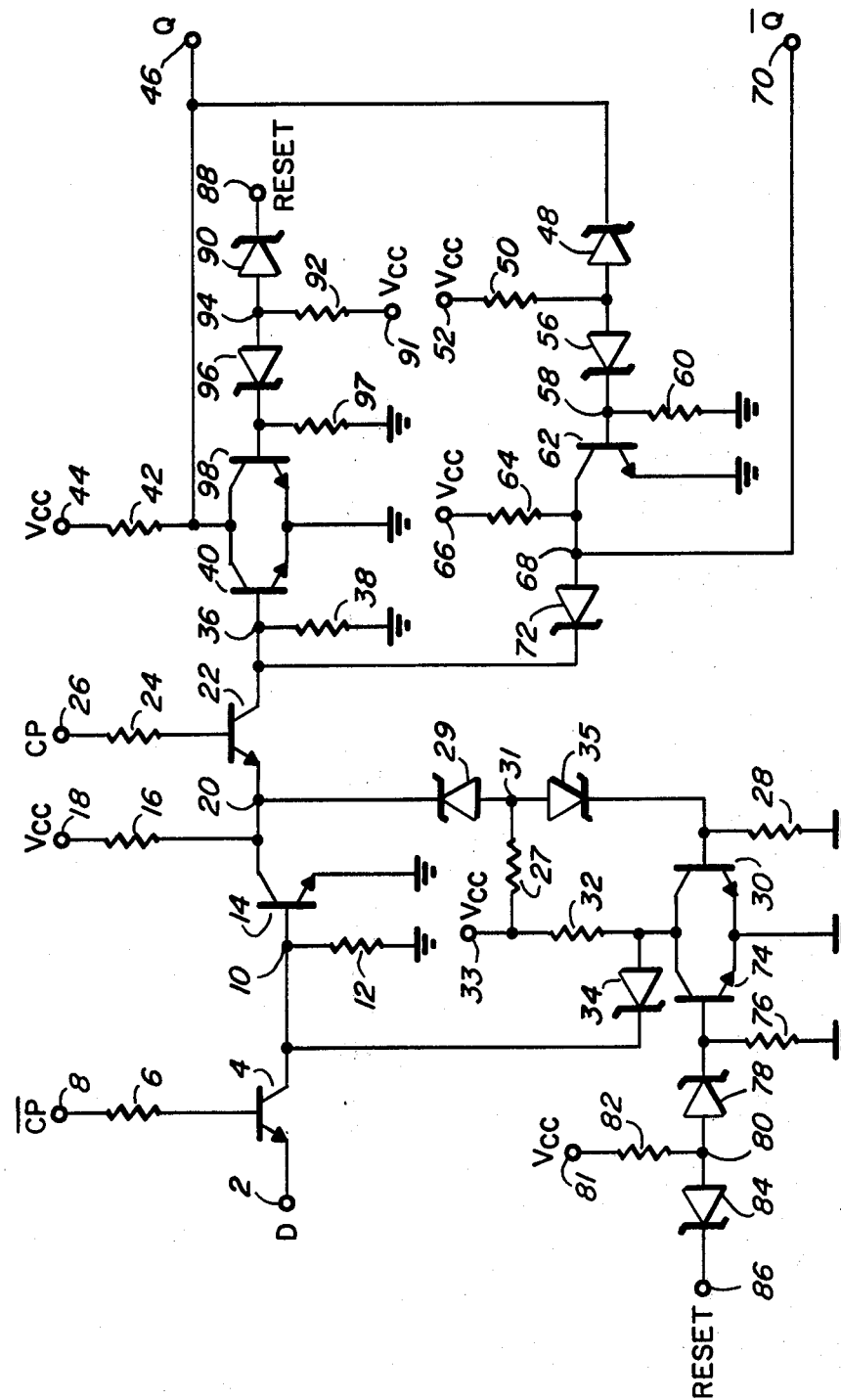
FIG. 2 is a schematic diagram of the inventive delay type flip-flop including a reset feature.

The circuit shown in FIG. 1 may be modified to include a reset function as is shown in FIG. 2. The basic circuit remains essentially the same and like elements have been denoted with like reference numerals. The master portion of the circuit has been modified by the inclusion of transistor 74 coupled in a common emitter configuration with transistor 30, resistor 76 coupled between ground and the base of transistor 74, and back to back diodes 78 and 84 having their junction node 80 coupled, via load resistor 82, to VCC at terminal 81. As long as a logical 0 is applied to reset terminal 86, the master portion of the flip-flop operates in the same manner as above described in connection with FIG. 1. If, however, a logical 1 is applied to terminal 86, diode 84 becomes reverse biased and current flows through resistor 82 and diode 78 to the base of transistor 74. Transistor 74 turns on causing a logical 0 to appear at the junction of the collectors of transistors 74 and 30. This forces a logical 0 at node 10 which, when propagated through the circuit, will result in a logical 0 at the output terminal 46. Resistor 76 coupled to the base of transistor 74 provides a discharge path for the base diffusion capacitance transistor 74.

The slave portion of the circuit also improves the reset circuitry; i.e., transistor 98 coupled in a common emitter configuration of transistor 40, back to back diodes 96 and 90 having a junction node 94 coupled to VCC (terminal 91) via load resistor 92. When a logical 1 is applied to terminal 88, diode 90 becomes back biased and current flows from VCC through resistor 92 and diode 96 to the base of transistor 98 turning it on. When this happens, the common collectors of transistors 40 and 98 go to ground resulting in a logical 0 at output terminal 46. Resistor 97 provides a discharge path for the base diffusion capacitance of transistor 98.

It should be clear that for some applications reset circuitry may be provided only in the slave portion of the circuit thus supplying a logical 0 at the flip-flop output for only one-half cycle.

Figure 3:
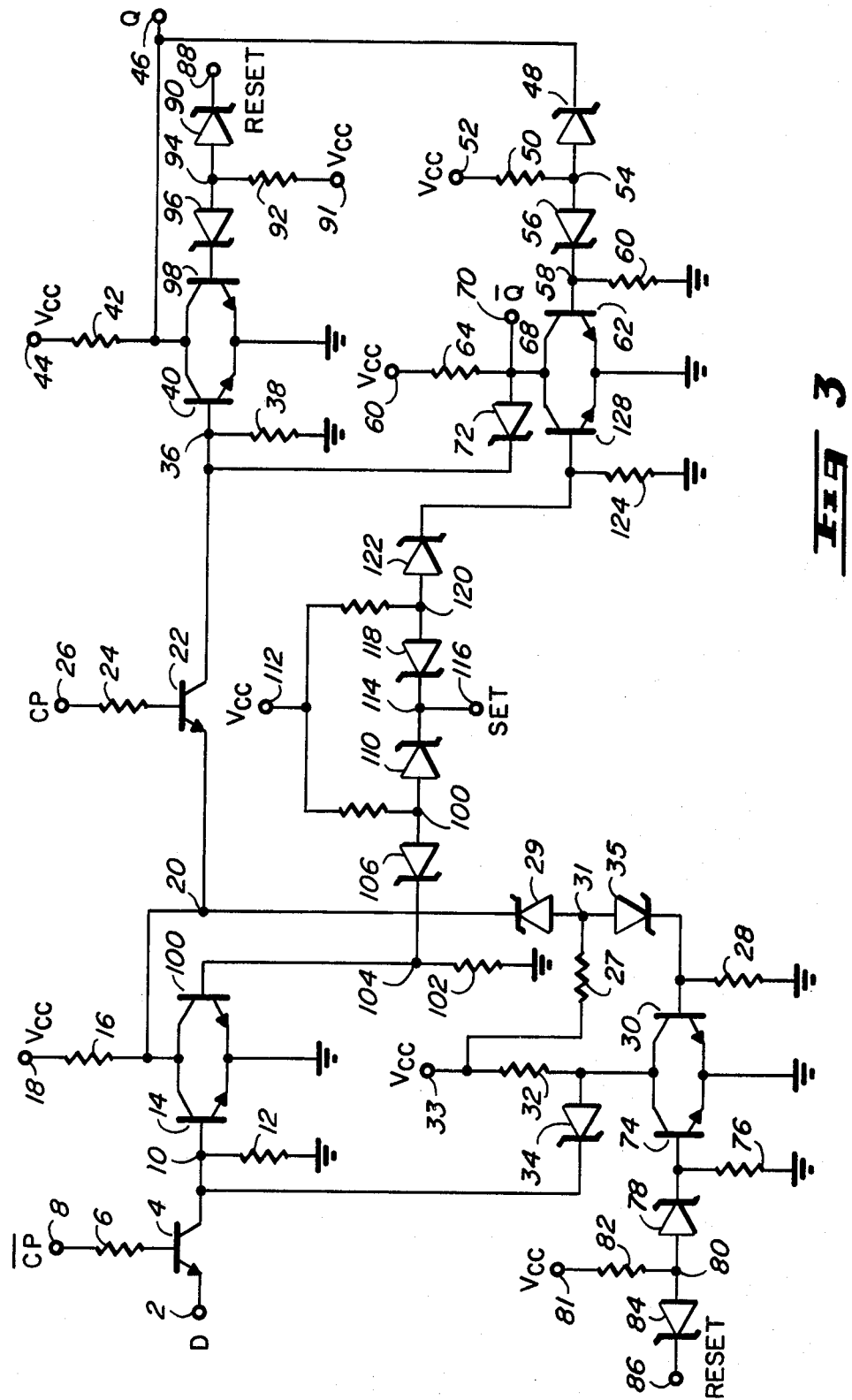
FIG. 3 is a schematic diagram of the inventive delay type flip-flop including both set and reset features.

FIG. 3 illustrates the circuitry shown in FIG. 2 with the addition of a set feature. Again, like components have been designated with like reference numerals. When a logical 1 is applied to the set input terminal 116 and, therefore, to node 114, diodes 110 and 118 are reverse biased. Current flows from VCC at terminal 112 through diodes 106 and 122 to the bases of transistors 100 and 128 respectively. With a logical one at the base of transistor 100, transistor 100 turns on bringing node 20 to a logical 0. As previously described, the logical 0 at node 20 will be transferred to node 36 and will be inverted by transistor 40 to produce a logical 1 at output terminal 46.

A logical one applied to the base of transistor 128 will cause transistor 128 to turn on bringing node 68 and therefore node 36 to ground. Again, this signal will be inverted by transistor 40 and will appear as a logical 1 at output terminal 46. Resistor 102 coupled between node 104 and ground and resistor 124 coupled between node 126 and ground provide discharge paths for the base diffusion capacitance of transistors 100 and 128 respectively.

The foregoing description of preferred embodiments of the invention is given by way of example only. Changes in form and detail may be made by one skilled in the art without departing from the spirit and scope of the invention. For example, the circuits shown in FIGS. 1, 2 and 3 may be implemented with NPN transistors (as shown), PNP transistors or MOS field effect transistors. It is therefore intended that the invention include all such modifications and equivalents which fall within the scope of the appended claims.

I claim:

1. A master-slave delay type flip-flop having a first input, a first non-inverted output and a first inverted output for receiving logical data at said first input and transferring said logical data to said first inverted and non-inverted outputs, said flip-flop being responsive to a clock signal capable of assuming first and second voltage levels, comprising:

a first transistor having an emitter coupled to said first input and a base coupled to said clock signal for transferring said data to its collector when said clock signal assumes said first voltage level;

a second transistor having an emitter coupled to ground and a base coupled to the collector of said first transistor for inverting said data at its collector;

a third transistor having an emitter coupled to the collector of said second transistor and a base coupled to said clock signal for transferring the inverted data to its collector when said clock signal assumes said second voltage level;

a fourth transistor having a base coupled to the collector of said third transistor and an emitter coupled to ground for reinverting said data at its collector to form said first non-inverted output;

first feedback means coupled between the collector and base of said second transistor for latching the base voltage of said second transistor;

second feedback means coupled between the base and collector of said fourth transistor for latching the voltage at the base of said fourth transistor;

reset means coupled to said first feedback means and to said first transistor for forcing said first non-inverted output to a logical 0 and forcing the base of said second transistor to a logical 0; and set means coupled to said second transistor and to said fourth transistor for forcing the base of said fourth transistor to a logical 0.

2. A master-slave delay type flip-flop according to claim 1 wherein said second feedback means includes an inverting transistor for producing said first inverted output.

3. A master-slave delay type flip-flop according to claim 1 wherein said first feedback means include a fifth transistor having an emitter coupled to ground, a base coupled to the collector of said second transistor and a collector coupled to the collector of said first transistor.

4. A master-slave delay type flip-flop according to claim 3 wherein said second feedback means includes a sixth transistor having an emitter coupled to the ground, a base coupled to the collector of said fourth transistor and a collector coupled to the base of said fourth transistor.

* * * * *